United States Patent
Yamada

(10) Patent No.: US 9,035,356 B2
(45) Date of Patent: May 19, 2015

(54) SEMICONDUCTOR DEVICE AND MANUFACTURING METHOD OF SEMICONDUCTOR DEVICE

(71) Applicant: Transphorm Japan, Inc., Yokohama, Kanagawa (JP)

(72) Inventor: Atsushi Yamada, Isehara (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/942,786

(22) Filed: Jul. 16, 2013

(65) Prior Publication Data

US 2014/0091315 A1    Apr. 3, 2014

(30) Foreign Application Priority Data

Sep. 28, 2012 (JP) .................... 2012-218246

(51) Int. Cl.
| | |
|---|---|
| *H01L 29/66* | (2006.01) |
| *H01L 29/778* | (2006.01) |
| *H01L 29/20* | (2006.01) |

(52) U.S. Cl.
CPC ........ *H01L 29/778* (2013.01); *H01L 29/66431* (2013.01); *H01L 29/66462* (2013.01); *H01L 29/7787* (2013.01); *Y02B 70/1483* (2013.01); *H01L 29/2003* (2013.01)

(58) Field of Classification Search
USPC .......................................... 257/194, 201, 76
See application file for complete search history.

(56) References Cited

U.S. PATENT DOCUMENTS

| | | | |
|---|---|---|---|
| 2002/0098607 A1 | 7/2002 | Okuyama et al. | |
| 2005/0023555 A1 | 2/2005 | Yoshida et al. | |
| 2005/0224781 A1 | 10/2005 | Kneissl et al. | |
| 2009/0057720 A1 | 3/2009 | Kaneko | |
| 2009/0121775 A1 | 5/2009 | Ueda et al. | |
| 2010/0109018 A1* | 5/2010 | Chen et al. | 257/76 |
| 2010/0244101 A1* | 9/2010 | Kokawa et al. | 257/201 |

(Continued)

FOREIGN PATENT DOCUMENTS

| | | |
|---|---|---|
| JP | 2007-019309 | 1/2007 |
| JP | 2009-076845 | 4/2009 |
| WO | WO 2012/066701 | 5/2012 |

OTHER PUBLICATIONS

Notice of Preliminary Rejection in Korean Application No. 10-2013-0087952, mailed Jul. 31, 2014, 3 pages.

(Continued)

*Primary Examiner* — Douglas Menz
(74) *Attorney, Agent, or Firm* — Fish & Richardson P.C.

(57) ABSTRACT

A semiconductor device includes an electron transit layer formed on a substrate; an electron supply layer formed on the electron transit layer; a doping layer formed on the electron supply layer, the doping layer being formed with a nitride semiconductor in which an impurity element to become p-type and C are doped; a p-type layer formed on the doping layer, the p-type layer being formed with a nitride semiconductor in which the impurity element to become p-type is doped; a gate electrode formed on the p-type layer; and a source electrode and a drain electrode formed on the doping layer or the electron supply layer. The p-type layer is formed in an area immediately below the gate electrode, and a density of the C doped in the doping layer is greater than or equal to $1 \times 10^{17}$ cm$^{-3}$ and less than or equal to $1 \times 10^{19}$ cm$^{-3}$.

10 Claims, 7 Drawing Sheets

(56) References Cited

U.S. PATENT DOCUMENTS

2012/0049180 A1    3/2012  Yamada
2013/0063076 A1*   3/2013  Shen ............................ 320/107

OTHER PUBLICATIONS

Office Action in Taiwan Application No. 102124894, mailed Feb. 12, 2015, 14 pages.

* cited by examiner

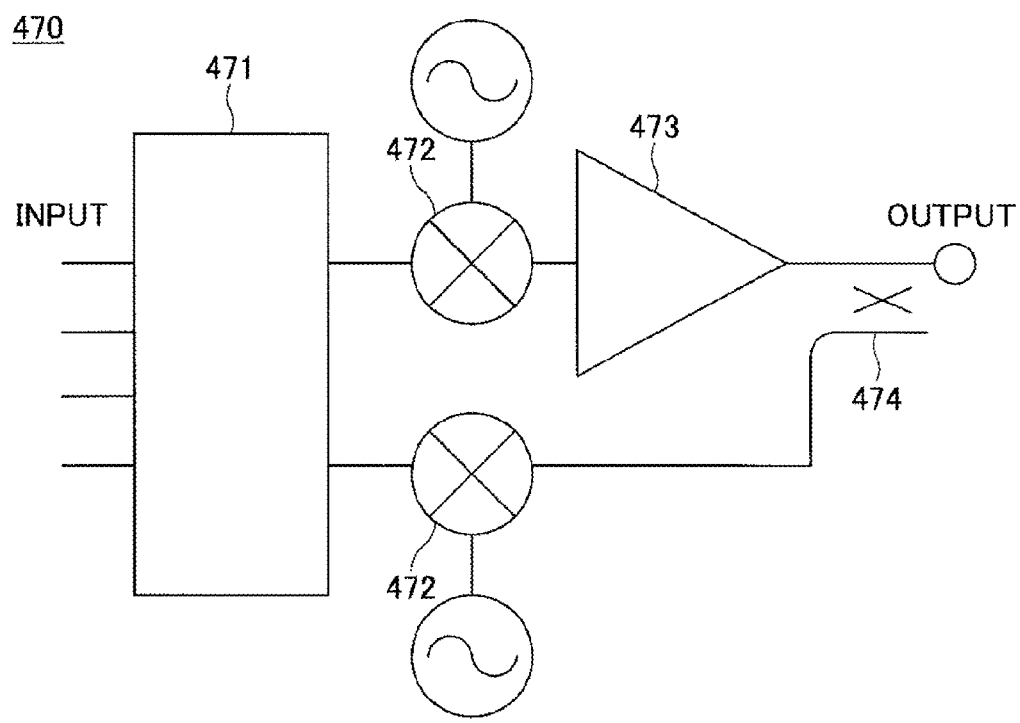

SEMICONDUCTOR DEVICE AND MANUFACTURING METHOD OF SEMICONDUCTOR DEVICE

CROSS-REFERENCE TO RELATED APPLICATION

This patent application is based upon and claims the benefit of priority of the prior Japanese Patent Application No. 2012-218246 filed on Sep. 28, 2012, the entire contents of which are incorporated herein by reference.

FIELD

The embodiments discussed herein are related to a semiconductor device and a manufacturing method of a semiconductor device.

BACKGROUND

GaN, AlN, InN, which are nitride semiconductors, or materials made of mixed crystals thereof, have a high saturated electron speed and a wide band gap, and studies are made to apply these materials to high breakdown voltage/high output electronic devices. As high breakdown voltage/high output electronic devices, technologies are developed in relation to Field effect transistors (FET), more particularly, High Electron Mobility Transistors (HEMT).

As a HEMT using a nitride semiconductor, there is an example in which the electron transit layer is formed with GaN and the electron supply layer is formed with AlGaN. In a HEMT having this structure, high density 2DEG (two-dimensional electron gas) is generated according to a distortion caused by the lattice constant difference between GaN and AlGaN, i.e., a so-called piezo polarization. Therefore, a high-efficiency, high-output semiconductor device is attained.

In a HEMT having a structure in which the electron transit layer is made of GaN and the electron supply layer is made of AlGaN, high density 2DEG is generated, and therefore it is difficult to make the HEMT become normally-off. In order to solve this problem, there is disclosed a method of forming a recess by removing a part of the electron supply layer in the area where the gate electrode is to be formed, and making the 2DEG disappear immediately below the gate electrode (see, for example, patent document 1). Furthermore, there is disclosed a method of forming a p-GaN layer between the gate electrode and the electron supply layer, and reducing the generation of 2DEG immediately below the gate electrode, so that the HEMT becomes normally-off (see, for example, patent document 2.

Patent document 1: Japanese Laid-Open Patent Publication No. 2009-76845

Patent document 2 Japanese Laid-Open Patent Publication No. 2007-19309

However, with the method of forming a recess, the damage caused by etching when forming a recess is applied near the electron transit layer, and therefore the on resistance increases and the leak current increases, which leads to deterioration in properties of the HEMT.

Furthermore, when forming a p-GaN layer between the electron supply layer and the gate electrode, generally, the p-GaN layer is formed by forming a p-GaN film on the entire surface of the electron supply layer, and then removing, by dry etching, the p-GaN film from areas excluding the area where a gate electrode is to be formed. However, GaN is a material that is significantly difficult for performing dry etching. Furthermore, it is not possible to perform etching by a high selection ratio between AlGaN and GaN, and therefore, it is difficult to remove only the p-GaN layer. Thus, in the area where the p-GaN layer is to be removed, there are cases where a part of the p-GaN layer remains, or cases where a part of the electron supply layer is removed from the area from which the p-GaN layer is to be removed. In these cases, the on resistance becomes high, and therefore properties of the HEMT are deteriorated. Furthermore, when variations arise in the thickness of the electron supply layer due to variations in etching performed by dry etching, variations arise in the properties of the HEMT, which leads to a decrease in yield ratio.

In the HEMT, when even a part of the electron supply layer is removed, the properties significantly deteriorate. Therefore, in order to prevent the electron supply layer from being damaged, the etching is performed in a state where a part of the p-GaN layer is remaining. However, if a part of the p-GaN layer remains in the area from which the p-GaN layer is to be removed, problems arise in addition to the above. That is, holes are generated in parts where the intervals between bands are discontinuous between the electron supply layer and the p-GaN layer, and a leak current is generated between the source and the drain.

SUMMARY

According to an aspect of the embodiments, a semiconductor device includes an electron transit layer formed on a substrate; an electron supply layer formed on the electron transit layer; a doping layer formed on the electron supply layer, the doping layer being formed with a nitride semiconductor in which an impurity element to become p-type and C are doped; a p-type layer formed on the doping layer, the p-type layer being formed with a nitride semiconductor in which the impurity element to become p-type is doped; a gate electrode formed on the p-type layer; and a source electrode and a drain electrode formed on the doping layer or the electron supply layer, wherein the p-type layer is formed in an area immediately below the gate electrode, and a density of the C doped in the doping layer is greater than or equal to $1\times10^{17}$ cm$^{-3}$ and less than or equal to $1\times10^{19}$ cm$^{-3}$.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 7 illustrates a structure of a high power amplifier according to the second embodiment.

DESCRIPTION OF EMBODIMENTS

Figure 1:
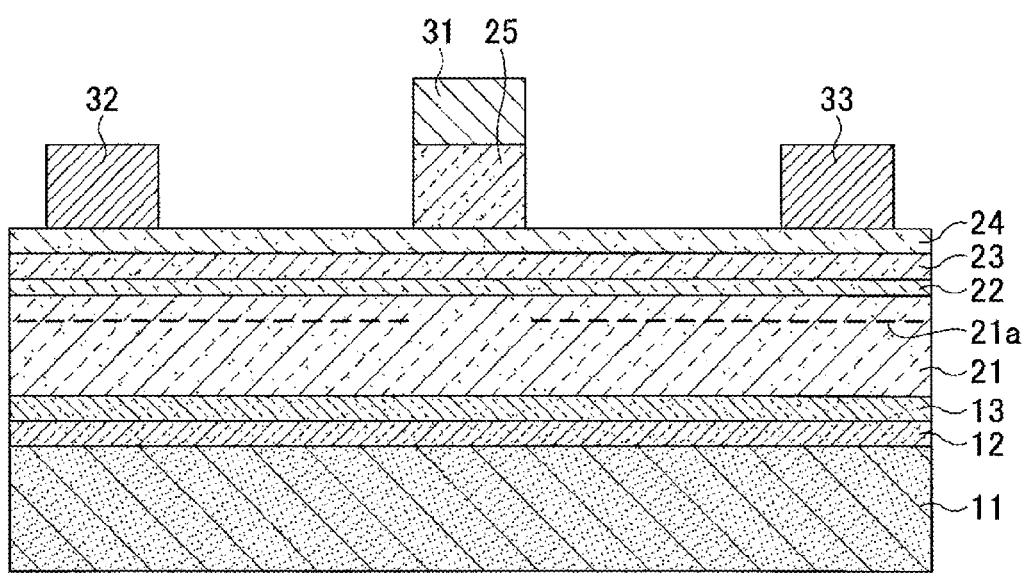
FIG. 1 illustrates a structure of a semiconductor device according to a first embodiment.

Preferred embodiments of the present invention will be explained with reference to accompanying drawings. In the following, the same members are denoted by the same reference numerals and are not further described.

First Embodiment

Semiconductor Device

A description is given of a semiconductor device according to a first embodiment. The semiconductor device according to the present embodiment is a HEMT having the structure illustrated in FIG. 1.

Specifically, a nucleation layer 12, a buffer layer 13, an electron transit layer 21, a spacer layer 22, an electron supply layer 23, and a doping layer 24 are formed with a nitride semiconductor material on a substrate 11 made of a semiconductor. Furthermore, on the doping layer 24, in an area where a gate electrode 31 is to be formed, a p-type layer 25 is formed, and the gate electrode 31 is formed on the p-type layer 25. Furthermore, on the doping layer 24, a source electrode 32 and a drain electrode 33 are formed. The source electrode 32 and the drain electrode 33 may be formed by removing the doping layer 24 from the area where the source electrode 32 and the drain electrode 33 are to be formed, and forming the source electrode 32 and the drain electrode 33 in contact with the electron supply layer 23.

In the present embodiment, a SiC substrate is used as the substrate 11. However, a Si (silicon) substrate, a sapphire substrate, or a GaN substrate may be used. Any one of a conductive substrate, a semi-insulating substrate, and an insulating substrate may be used. The nucleation layer 12 is formed with AlN, and the buffer layer 13 is formed with AlGaN. The electron transit layer 21 is formed with i-GaN having a thickness of approximately 3 µm, and the spacer layer 22 is formed with i-AlGaN having a thickness of approximately 5 nm. The electron supply layer 23 is formed with n-AlGaN having a thickness of approximately 30 nm, and Si is doped at a density of approximately $5 \times 10^{18}$ cm$^{-3}$ as an n-type impurity element. Accordingly, 2DEG 21a is generated in the electron transit layer 21 near the interface between the electron transit layer 21 and the spacer layer 22.

The doping layer 24 is formed with GaN having a thickness of approximately 5 nm, in which Mg is doped at a density of approximately $4 \times 10^{19}$ cm$^{-3}$ as a p-type impurity element and C is doped at a density of approximately $1 \times 10^{19}$ cm$^{-3}$. By doping C in GaN to form the doping layer 24, the function of Mg functioning as an acceptor doped in the doping layer 24 is cancelled out, and therefore holes are prevented from being generated. Generally, the activation rate of Mg doped in GaN is approximately 1% through 2%. Therefore, assuming that the doping density of Mg is $1 \times 10^{19}$ cm$^{-3}$ through $4 \times 10^{19}$ cm$^{-3}$, the density of Mg that is activated is approximately $1 \times 10^{17}$ cm$^{-3}$ through $8 \times 10^{17}$ cm$^{-3}$. Thus, by setting the doping density of C to approximately the same as or more than this density, holes are prevented from being generated, and therefore the doping density of C is preferably greater than or equal to $1 \times 10^{17}$ cm$^{-3}$ and less than or equal to $1 \times 10^{19}$ cm$^{-3}$. The p-type layer 25 is formed with p-GaN having a thickness of approximately 50 nm, and Mg is doped at a density of approximately $4 \times 10^{19}$ cm$^{-3}$ as a p-type impurity element. Furthermore, to make the p-type layer 25 function as a p-type, an impurity element to be a p-type such as Mg is preferably doped in the p-type layer 25 at a density of greater than or equal to $1 \times 10^{18}$ cm$^{-3}$.

Note that the spacer layer 22 and the electron supply layer 23 may be formed with InAlN. For example, the spacer layer 22 may be formed with i-In$_{0.17}$Al$_{0.83}$N, and the electron supply layer 23 may be formed with n-In$_{0.17}$Al$_{0.83}$N. Furthermore, as the p-type impurity element, Be may be used other than Mg.

Manufacturing Method of Semiconductor Device

Next, with reference to FIGS. 2A through 3B, a description is given of a method of manufacturing the semiconductor device according to the present embodiment.

Figure 2A:
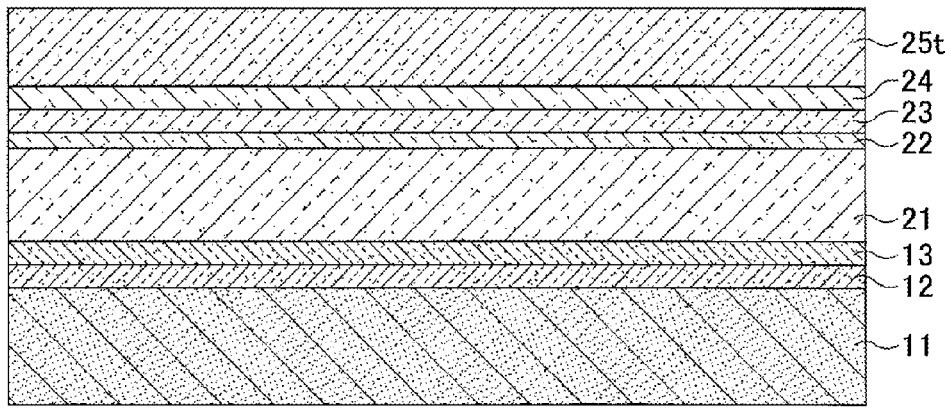
FIGS. 2A through 2C illustrate procedures of a method of manufacturing the semiconductor device according to the first embodiment (1)

First, as illustrated in FIG. 2A, on the substrate 11, nitride semiconductor layers such as the nucleation layer 12, the buffer layer 13, the electron transit layer 21, the spacer layer 22, the electron supply layer 23, the doping layer 24, and a p-type film 25t are sequentially laminated. In the present embodiment, these nitride semiconductor layers are formed by epitaxial growth according to MOVPE (Metal-Organic Vapor Phase Epitaxy).

When causing the above nitride semiconductor layers to grow epitaxially according to MOVPE, trimethyl gallium (TMG) as a raw material gas of gallium (Ga), aluminum trimethyl (TMA) as a raw material gas of aluminum (Al), and ammonia (NH$_3$) as a raw material gas of nitrogen (N) are used. Furthermore, silane (SiH$_4$) is used as the raw material gas of Si that is doped as an n-type impurity element, and cyclopentadienyl magnesium (Cp2Mg) is used as a raw material gas of Mg that is a p-type impurity element. By adjusting the supply amount of these raw material gases supplied in a chamber, nitride semiconductor layers having desired composition ratios are formed. These raw material gasses are supplied in the chamber of the MOVPE device by using hydrogen (H$_2$) as the carrier gas. Note that the substrate temperature when forming these nitride semiconductor layers is approximately 1000° C. Furthermore, in the present application, the ratio of the number of molecules of the raw material gas of TMA and the III family of TMA, to the number of molecules of NH$_3$ that is the raw material gas of the V family supplied in the chamber, may be described as the supply ratio of V family/III family.

Specifically, AlN to form the nucleation layer 12 is formed by supplying TMA and NH$_3$. AlGaN to form the buffer layer 13 is formed by supplying TMA, TMG, and NH$_3$. In this case, the supply ratio of V family/III family supplied in the chamber is greater than or equal to 100, and the pressure inside the chamber is less than or equal to 10 kPa.

i-GaN having a thickness of approximately 3 µm to form the electron transit layer 21 is formed by supplying TMG and NH$_3$. In this case, the supply ratio of V family/III family supplied in the chamber is greater than or equal to 10000, and the pressure inside the chamber is greater than or equal to 30 kPa.

i-Al$_{0.3}$Ga$_{0.7}$N having a thickness of approximately 5 nm to form the spacer layer 22 is formed by supplying TMA, TMG, and NH$_3$. In this case, the supply ratio of V family/III family supplied in the chamber is greater than or equal to 100, and the pressure inside the chamber is less than or equal to 10 kPa.

n-Al$_{0.3}$Ga$_{0.7}$N having a thickness of approximately 30 nm to form the electron supply layer 23 is formed by supplying TMA, TMG, and NH$_3$, and by supplying a predetermined amount of SiH$_4$ as the raw material gas of Si. Accordingly, in the electron supply layer 23, Si is doped at a density of approximately $5 \times 10^{18}$ cm$^{-3}$ as an n-type impurity element. In this case, the supply ratio of V family/III family supplied in the chamber is greater than or equal to 100, and the pressure inside the chamber is less than or equal to 10 kPa.

GaN having a thickness of approximately 5 nm to form the doping layer 24 is formed by supplying TMG and NH$_3$, and by supplying a predetermined amount of Cp2Mg. Accordingly, in the doping layer 24, Mg is doped at a density of approximately $4\times10^{19}$ cm$^{-3}$ as a p-type impurity element. In this case, the supply ratio of V family/III family supplied in the chamber is less than or equal to 1000, more specifically, approximately 1000, and the pressure inside the chamber is less than or equal to 10 kPa. When the doping layer 24 is formed under these conditions, C included in TMG is taken into the doping layer 24, and therefore in the doping layer 24, C is doped at a density of approximately $1\times10^{19}$ cm$^{-3}$. Therefore, in the present embodiment, in the doping layer 24, two types of impurity elements are doped, i.e., Mg to be p-type and C to cancel out the function of p-type.

That is to say, when forming a GaN layer by supplying TMG and NH$_3$ according to MOVPE, if the pressure inside the chamber decreases, a large amount of C included in TMG is taken into the GaN layer. Furthermore, when forming the GaN layer, and the supply ratio of V family/III family decreases, a large amount of C included in TMG is taken into the GaN layer. The present embodiment is based on this finding. The doping layer 24 formed under a condition where the pressure inside the chamber is lower than that in the case of forming the electron transit layer 21 with i-GaN, and also under a condition where the supply ratio of V family/III family is lower than that in the case of forming the electron transit layer 21 with i-GaN. By forming the GaN layer under the above conditions, C is doped in GaN into the doping layer 24. Accordingly, when forming the doping layer 24, C is doped in the doping layer 24 without supplying an impurity raw material gas for doping C, and therefore, C is efficiently doped at a low cost. Note that the density of C doped in the doping layer 24 is made to be a desired density by adjusting the pressure and the supply ratio of V family/III family in the chamber.

Thus, the doping layer 24 is more preferably formed under a condition where the pressure inside the chamber is lower than that in the case of forming the electron transit layer 21, and under a condition where the supply ratio of V family/III family is lower than that in the case of forming the electron transit layer 21. Furthermore, from the viewpoint of manufacturing, the doping layer 24 is preferably formed by substantially the same pressure as that used when forming the electron supply layer 23.

p-GaN having a thickness of approximately 50 nm to form the p-type film 25$t$ is formed by supplying TMG and NH$_3$, and by supplying a predetermined amount of Cp2Mg. Accordingly, in the p-type film 25$t$, Mg is doped at a density of approximately $4\times10^{19}$ cm$^{-3}$ as a p-type impurity element. In this case, the supply ratio of V family/III family supplied in the chamber is greater than or equal to approximately 10000, and the pressure inside the chamber is greater than or equal to 30 kPa. Thus, hardly any of the C included in TMG is taken into the p-type film 25$t$.

Subsequently, photoresist is applied on the p-type film 25$t$, and exposing and developing are performed with an exposing device, to form a resist pattern (not illustrated) having an opening in the area where an element separating area is to be formed. Subsequently, in the nitride semiconductor layer in the area where the resist pattern is not formed, an element separating area (not illustrated) is formed by performing dry etching using chlorine-based gas or ion implantation. Subsequently, the resist pattern is removed with an organic solvent.

Figure 2B:
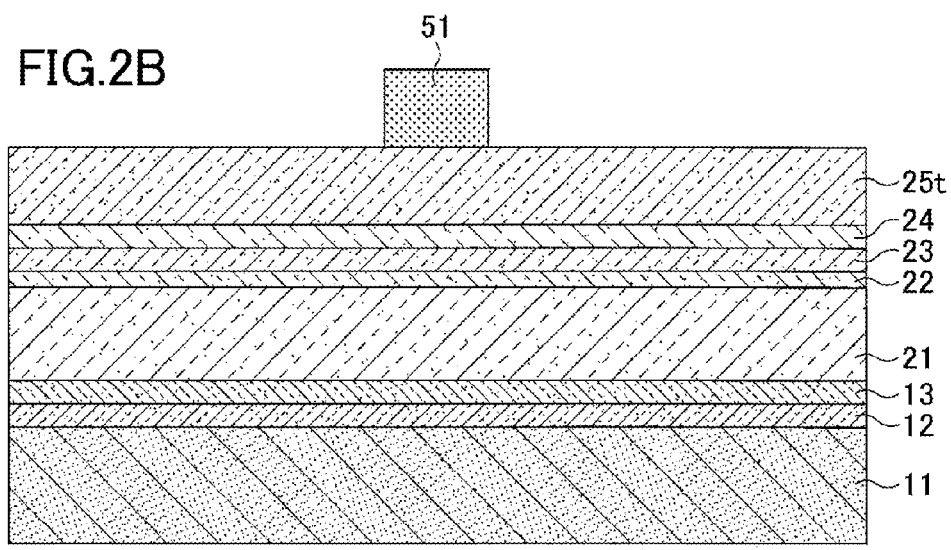

Next, as illustrated in FIG. 2B, a resist pattern 51 is formed on the p-type film 25$t$ in the area where the p-type layer 25 is to be formed. Specifically, photoresist is applied on the surface of the p-type film 25$t$, and exposing and developing are performed with an exposing device, to form the resist pattern 51 in the area where the p-type layer 25 is to be formed, i.e., where the gate electrode 31 is to be formed.

Figure 2C:
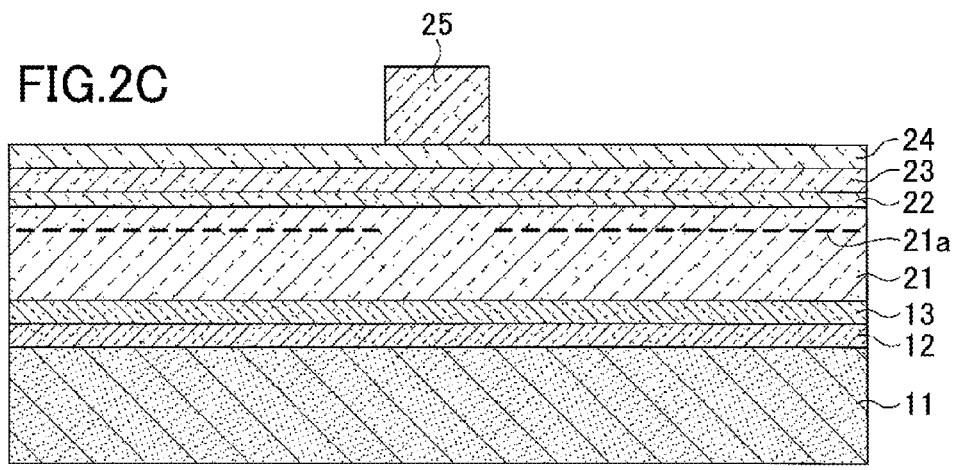

Next, as illustrated in FIG. 2C, the p-type film 25$t$ is removed by dry etching from the area where the resist pattern 51 is not formed, so that the p-type layer 25 is formed in the area where the resist pattern 51 is formed.

In this case, etching is performed until the p-type film 25$t$ is completely removed from areas excluding the area where the gate electrode 31 is to be formed. Accordingly, a part of the doping layer 24 is removed by dry etching, but the dry etching is stopped in a state where the electron supply layer 23 formed below the doping layer 24 is not exposed. In order to stop the dry etching in a state where the electron supply layer 23 is not exposed as described above, the doping layer 24 is preferably formed to have a thickness of greater than or equal to 5 nm and less than or equal to 15 nm. In the present embodiment, an example of dry etching as described above is RIE (Reactive Ion Etching).

As described above, in the present embodiment, it is possible to make the 2DEG 21$a$ disappear immediately below the area where the p-type layer 25 is formed, without reducing the 2DEG 21$a$ that is present immediately below areas where the p-type layer 25 is not formed. Therefore, a HEMT that becomes normally-off and that has a low on resistance is attained.

As described above, the doping layer 24 preferably has a thickness of greater than or equal to 5 nm and less than or equal to 15 nm. If the thickness of the doping layer 24 is less than 5 nm, there are cases where, due to unevenness in etching, the doping layer 24 is removed and a part of the electron supply layer 23 is removed, before the p-type film 25$t$ is completely removed from the area where the resist pattern 51 is not formed. Furthermore, if the doping layer 24 is thick, the effect of forming the p-type layer 25 becomes weak, and the HEMT hardly becomes normally-off, and therefore the thickness of the doping layer 24 is preferably less than or equal to 15 nm. Furthermore, as to the doping layer 24, over etching may be performed according to need. Furthermore, in the area where the resist pattern 51 is not formed, even if a part of the doping layer 24 remains, this does not affect the properties of the HEMT.

Subsequently, the resist pattern 51 is removed with an organic solvent, so that the structure illustrated in FIG. 2C is attained.

Figure 3A:
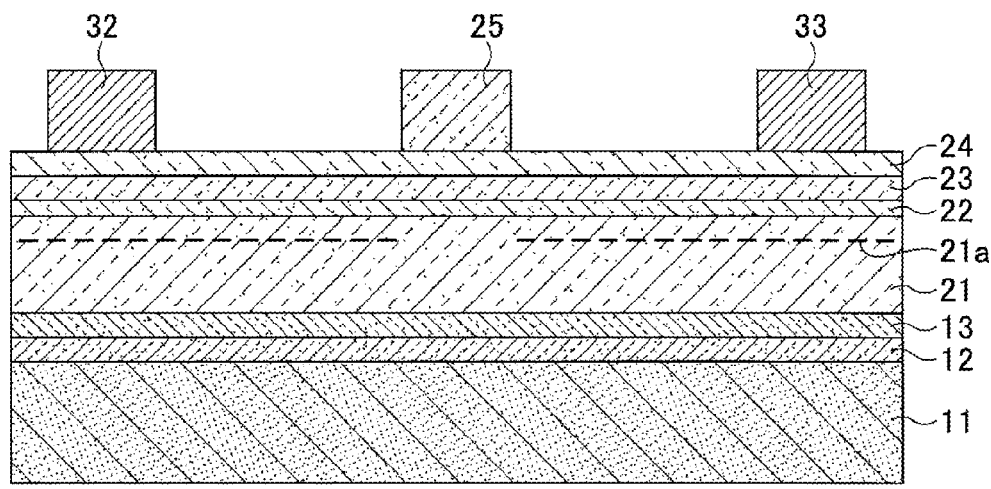
FIGS. 3A and 3B illustrate procedures of the method of manufacturing the semiconductor device according to the first embodiment (2)

Next, as illustrated in FIG. 3A, on the doping layer 24, the source electrode 32 and the drain electrode 33 are formed. Specifically, photoresist is applied on the p-type layer 25 and the doping layer 24, and exposing and developing are performed with an exposing device, to form a resist pattern having an opening in the area where the source electrode 32 and the drain electrode 33 are to be formed. Subsequently, a metal laminated film formed with Ta/Al (thickness, Ta: 200 nm, Al: 200 nm) is formed by vacuum vapor deposition. Subsequently, by immersing this in an organic solvent, the metal laminated film formed on the resist pattern is lifted off together with the resist pattern and removed. Accordingly, with the remaining metal laminated film, the source electrode 32 and the drain electrode 33 are formed. Subsequently, in a nitrogen atmosphere, heat treatment is performed at a temperature of 400° C. through 1000° C., for example, at 550° C., to cause the source electrode 32 and the drain electrode 33 be in ohmic contact with the doping layer 24. When ohmic contact may be attained without performing heat treatment, heat treatment is not performed.

The expression Ta/Al means a metal laminated film having two layers, in which Ta is the bottom layer and Al is the top layer. Furthermore, the source electrode 32 and the drain electrode 33 may be formed after removing a part of the doping layer 24 and the electron supply layer 23 from the area where the source electrode 32 and the drain electrode 33 are to be formed.

Figure 3B:
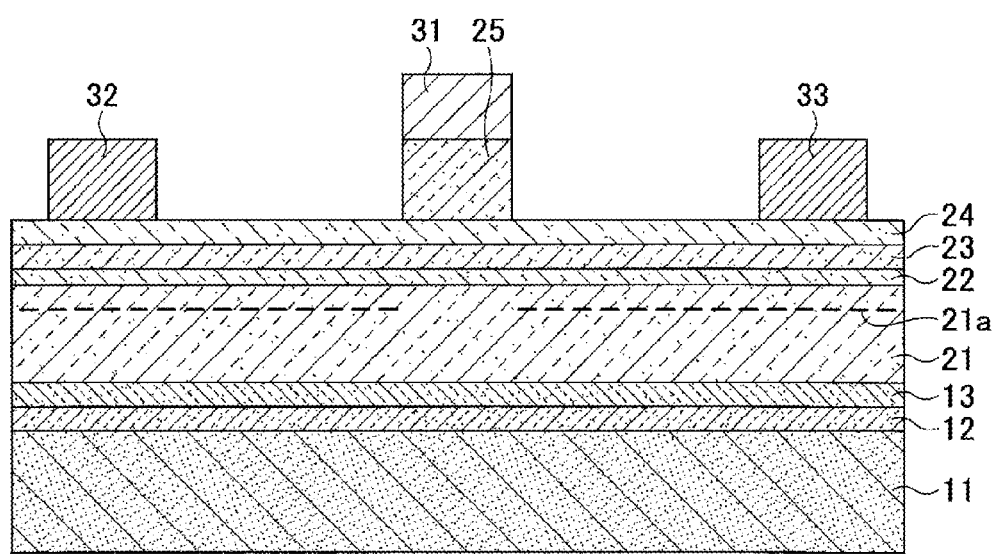

Next, as illustrated in FIG. 3B, the gate electrode 31 is formed on the p-type layer 25. Specifically, photoresist is applied on the p-type layer 25 and the doping layer 24, and exposing and developing are performed with an exposing device, to form a resist pattern having an opening in the area where the gate electrode 31 is to be formed. Subsequently, a metal laminated film formed with Ni/Au (thickness, Ni: 30 nm, Au: 400 nm) is formed by vacuum vapor deposition. Subsequently, by immersing this in an organic solvent, the metal laminated film formed on the resist pattern is lifted off together with the resist pattern and removed. Accordingly, with the remaining metal laminated film, the gate electrode 31 is formed on the p-type layer 25. Subsequently, heat treatment may be performed according to need.

The gate electrode 31, the source electrode 32, and the drain electrode 33 may be formed by combining metal materials other than those described above, and may have structures other than those described above, such as a metal film including a single layer. Furthermore, the method of forming the gate electrode 31, the source electrode 32, and the drain electrode 33 may be formed by methods other than the above.

By the above method, the semiconductor device according to the present embodiment is fabricated.

Second Embodiment

Next, a description is given of a second embodiment. The present embodiment is relevant to a semiconductor device, a power unit, and a high power amplifier.

Figure 4:
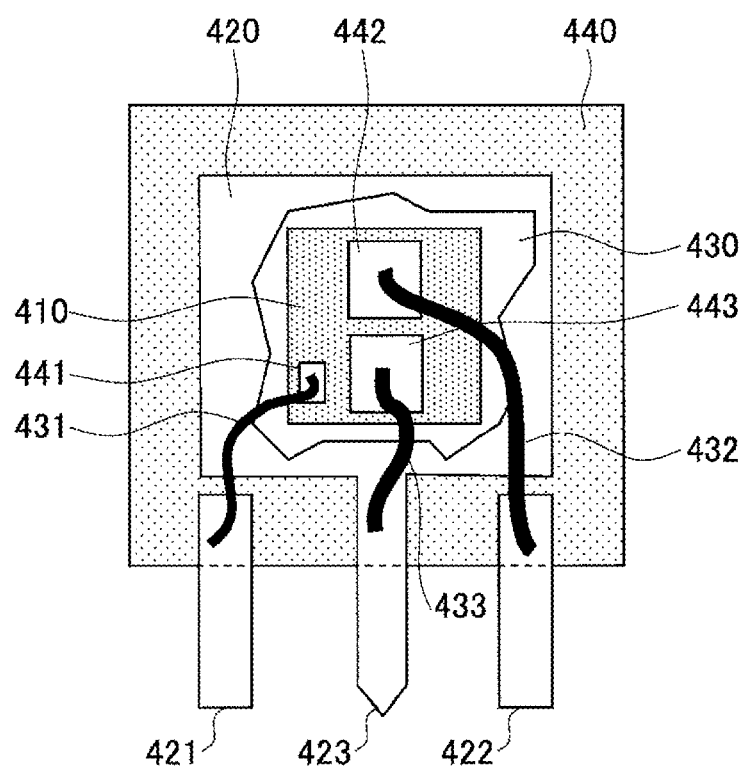
FIG. 4 schematically illustrates a discretely packaged semiconductor device according to a second embodiment.

The semiconductor device according to the present embodiment is formed by discretely packaging the semiconductor device according to the first embodiment. A description is given of this discretely packaged semiconductor device with reference to FIG. 4. FIG. 4 schematically illustrates the inside of the discretely packaged semiconductor device, and the locations of electrodes are different from those of the first embodiment.

First, the semiconductor device manufactured according to the first embodiment or the second embodiment is cut by dicing, and a semiconductor chip 410 that is a HEMT made of a GaN system material is formed. The semiconductor chip 410 is fixed on a lead frame 420 by a diatouch agent 430 such as solder.

Next, the gate electrode 441 is connected to a gate lead 421 by a bonding wire 431, the source electrode 442 is connected to a source lead 422 by a bonding wire 432, and the drain electrode 443 is connected to a drain lead 423 by a bonding wire 433. The bonding wires 431, 432, and 433 are formed by a metal material such as Al. Furthermore, in the present embodiment, the gate electrode 441 is a gate electrode pad, which is connected to the gate electrode 31 of the semiconductor device according to the first embodiment. Similarly, the source electrode 442 is a source electrode pad, which is connected to the source electrode 32. Furthermore, the drain electrode 443 is a drain electrode pad, which is connected to the drain electrode 33.

Next, resin sealing is performed with mold resin 440 by a transfer mold method. As described above, a discretely packaged semiconductor chip that is a HEMT made of a GaN system material is manufactured.

PFC Circuit, Power Unit, and High Power Amplifier

Next, a description is given of a PFC (Power Factor Correction) circuit, a power unit, and a high power amplifier according to the present embodiment. The PFC circuit, the power unit, and the high power amplifier according to the present embodiment use the semiconductor device according to the first embodiment.

PFC Circuit

Next, a description is given of a PFC circuit according to the present embodiment. The PFC circuit according to the present embodiment includes the semiconductor device according to the first embodiment.

Figure 5:
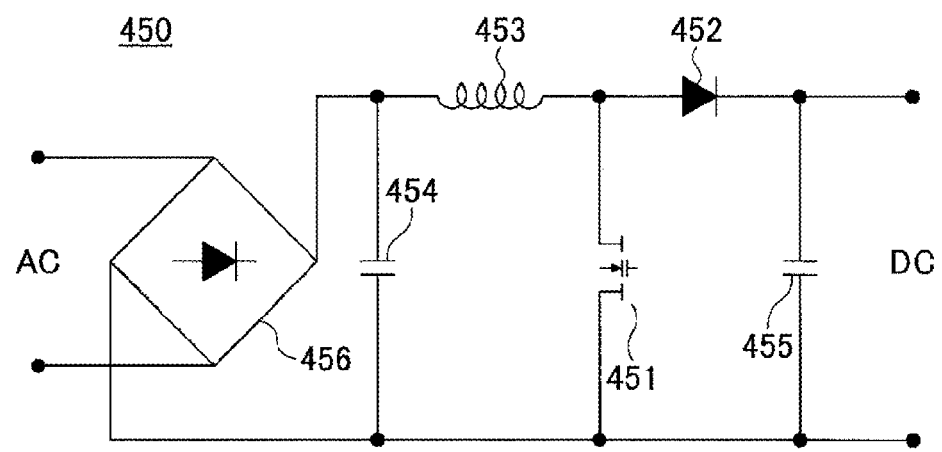
FIG. 5 is a circuit diagram of a PFC circuit according to the second embodiment.

With reference to FIG. 5, a description is given of the PFC circuit according to the present embodiment. A PFC circuit 450 according to the present embodiment includes a switch element (transistor) 451, a diode 452, a choke coil 453, capacitors 454, 455, a diode bridge 456, and an AC (alternating-current) source (not illustrated). As the switch element 451, the HEMT that is the semiconductor device according to the first embodiment is used.

In the PFC circuit 450, the drain electrode of the switch element 451 is connected to the anode terminal of the diode 452 and one of the terminals of the choke coil 453. Furthermore, the source electrode of the switch element 451 is connected to one of the terminals of the capacitor 454 and one of the terminals of the capacitor 455. The other terminal of the capacitor 454 is connected to the other terminal of the choke coil 453. The other terminal of the capacitor 455 is connected to the cathode terminal of the diode 452, and between the two terminals of the capacitor 454, the AC source (not illustrated) is connected via the diode bridge 456. In this PFC circuit 450, from between the two terminals of the capacitor 455, a direct current (DC) is output.

Power Unit

Figure 6:
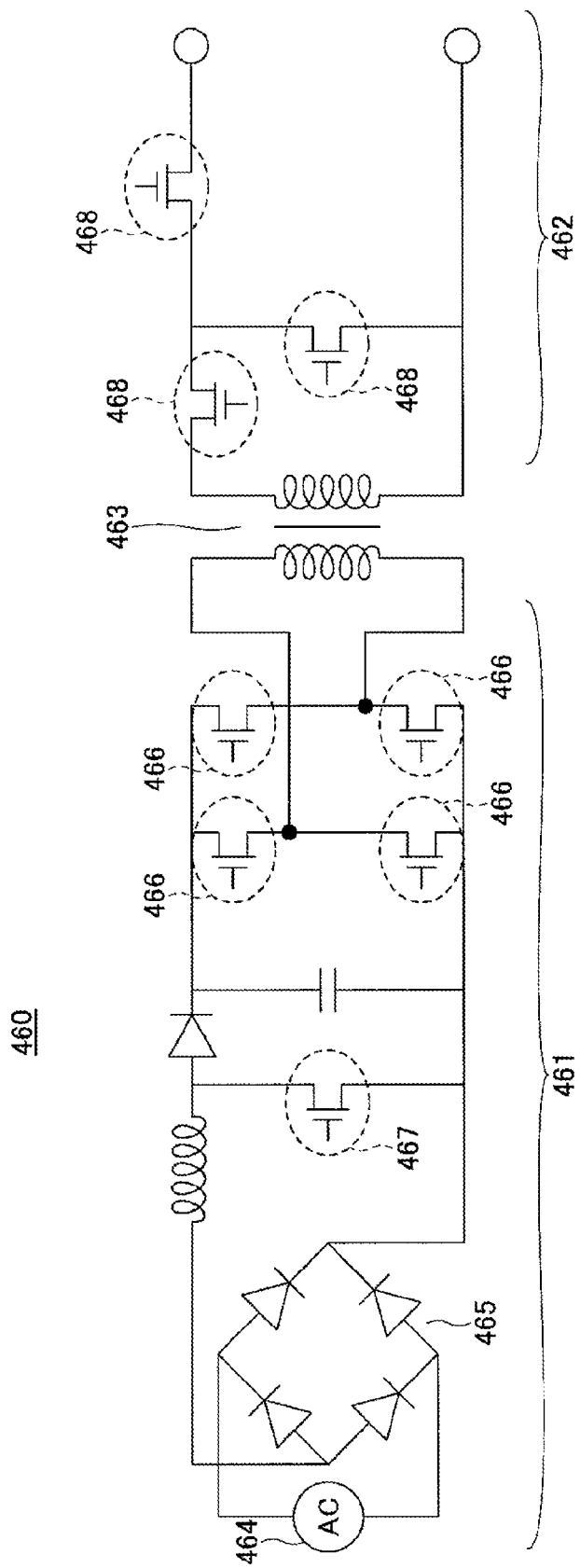
FIG. 6 is a circuit diagram of a power unit according to the second embodiment.

With reference to FIG. 6, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, a so-called bridge rectifier circuit 465, plural switching elements (four in the example of FIG. 6) 466, and one switching element 467. The low voltage secondary side circuit 462 includes plural switching elements 468 (three in the example of FIG. 6). In the example of FIG. 6, the semiconductor device according to the first embodiment is used as the switching elements 466 and the switching element 467 of the high voltage primary side circuit 461. The switching elements 466 and 467 of the primary side circuit 461 are preferably normally-off semiconductor devices. Furthermore, switching elements 468 used in the low voltage secondary side circuit 462 are typical MISFET (Metal Insulator Semiconductor Field Effect Transistor) made of silicon.

High Power Amplifier

Next, with reference to FIG. 7, a description is given of the high power amplifier according to the present embodiment. A high power amplifier 470 according to the present embodiment may be applied to a power amplifier of a base station of mobile phones. The high power amplifier 470 includes a digital predistortion circuit 471, mixers 472, a power amplifier 473, and a directional coupler 474. The digital predistortion circuit 471 offsets the non-linear strains of input signals. The mixers 472 mix the input signals, whose non-linear strains have been offset, with AC signals. The power amplifier 473 amplifies the input signals that have been mixed with the AC signals. In the example of FIG. 7, the power amplifier 473 includes the semiconductor device according to the first embodiment. The directional coupler 474 monitors input signals and output signals. In the circuit of FIG. 7, for example, the switch may be switched so that output signals are mixed with AC signals by the mixers 472 and sent to the digital predistortion circuit 471.

According to a semiconductor device and a manufacturing method of the semiconductor device according to an aspect of the embodiments, the semiconductor device which becomes normally-off and the leak current in the semiconductor device is reduced.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   an electron transit layer formed on a substrate;
   an electron supply layer formed on the electron transit layer;
   a doping layer formed on the electron supply layer, the doping layer being formed with a nitride semiconductor in which an impurity element to become p-type and C are doped;
   a p-type layer formed on the doping layer, the p-type layer being formed with a nitride semiconductor in which the impurity element to become p-type is doped;
   a gate electrode formed on the p-type layer; and
   a source electrode and a drain electrode formed on the doping layer or the electron supply layer, wherein
   the p-type layer is formed in an area immediately below the gate electrode, and
   a density of the C doped in the doping layer is greater than or equal to $1 \times 10^{17}$ cm$^{-3}$ and less than or equal to $1 \times 10^{19}$ cm$^{-3}$.

2. The semiconductor device according to claim 1, wherein the impurity element to become p-type is Mg or Be.

3. The semiconductor device according to claim 1, wherein in the doping layer and the p-type layer, a density of the impurity element to become p-type before being doped is greater than or equal to $1 \times 10^{18}$ cm$^{-3}$.

4. The semiconductor device according to claim 1, wherein the p-type layer is formed with a material including GaN.

5. The semiconductor device according to claim 1, wherein the doping layer is formed with a material including GaN.

6. The semiconductor device according to claim 1, wherein the doping layer has a thickness of greater than or equal to 5 nm and less than or equal to 15 nm.

7. The semiconductor device according to claim 1, wherein the electron transit layer is formed with a material including GaN.

8. The semiconductor device according to claim 1, wherein the electron supply layer is formed with a material including AlGaN or InAlN.

9. A power unit comprising the semiconductor device according to claim 1.

10. An amplifier comprising the semiconductor device according to claim 1.

* * * * *